(12) United States Patent
Bäcker et al.

(10) Patent No.: US 7,763,569 B2
(45) Date of Patent: Jul. 27, 2010

(54) PROCESS FOR THE PRODUCTION OF HIGHLY-TEXTURED, BAND-SHAPED, HIGH-TEMPERATURE SUPERCONDUCTORS

(75) Inventors: Michael Bäcker, Köln (DE); Brigitte Schlobach, Bannewitz (DE); Kerstin Knoth, Dresden (DE); Barbara Schüpp-Niewa, Hallbergmoos (DE); Bernhard Holzapfel, Dresden (DE); Martina Falter, Swisttal-Buschhoven (DE)

(73) Assignee: Zenergy Power GmbH (DE)

( * ) Notice: Subject to any disclaimer, the term of this patent is extended or adjusted under 35 U.S.C. 154(b) by 640 days.

(21) Appl. No.: 11/678,704

(22) Filed: Feb. 26, 2007

(65) Prior Publication Data

US 2007/0197397 A1   Aug. 23, 2007

Related U.S. Application Data

(63) Continuation of application No. PCT/EP2005/08962, filed on Aug. 18, 2005.

(30) Foreign Application Priority Data

Aug. 25, 2004   (DE) .................. 10 2004 041 053

(51) Int. Cl.
   *H01L 39/24*   (2006.01)
(52) U.S. Cl. .................. 505/470; 427/62; 505/234
(58) Field of Classification Search .............. 505/234, 505/235, 236, 470; 427/62
   See application file for complete search history.

(56) References Cited

U.S. PATENT DOCUMENTS 6,562,761 B1   5/2003   Fritzemeier et al.
7,109,151 B2 *   9/2006   Lee et al. ............... 505/237
2002/0086799 A1*   7/2002   Araki et al. .............. 505/100
2002/0139960 A1   10/2002   Manabe et al.
2002/0144838 A1   10/2002   Fritzemeier et al.

FOREIGN PATENT DOCUMENTS

WO   WO00/60132   10/2000
WO   2007017073 A2   2/2007

OTHER PUBLICATIONS

Co-pending U.S. Appl. No. 11/671,120, filed Feb. 5, 2007, and entitled Process for the Production of Highly-Textured, Band-Shaped, High-Temperature Superconductors.

Applied Physics Letter 52 (1988), pp. 2077-2079, Entitled "Superconducting oxide films with high transition temperature prepared from metal trifluoroacetate precursors" by A. Gupta et al.

(Continued)

*Primary Examiner*—Stanley Silverman
*Assistant Examiner*—Paul A Wartalowicz
(74) *Attorney, Agent, or Firm*—Edell, Shapiro & Finnan, LLC

(57) ABSTRACT

A wet-chemical method for producing strip-shaped high-temperature superconductors with a substrate, optionally with a buffer layer and with a high-temperature superconductive layer is improved by increasing the texturing and the layer thickness of the high-temperature superconductive layer. To this end, precursor solutions are applied in layers to the substrate, of which the first is low in fluorine or does not contain fluorine, and the following have a fluorine concentration that increases with each layer.

25 Claims, 14 Drawing Sheets

OTHER PUBLICATIONS

IEEE Transactions on Applied Superconductivity, vol. 11, (2001), Entitled "Fabrication of long lengths of YBCO coated conductors using a continuous reel-to-reel dip-coating unit", pp. 3146-3149.

Superconductor Science and Technology 16, (2003), Entitled "Review of a chemical approach to YBa2Cu3O7-x-coated superconductors—metalorganic deposition using trifluoroacetates", by T. Araki and I. Hirabayashi.

Ullmann's Encyclopedia of Industrial Chemistry, Article Entitled "Photography".

Dawley, J.T. et al., Thick Sol-gel Derived YBa2Cu3O7-d Films, IEEE Transactions on Applied Superconductivity, vol. II, No. 1, Mar. 2001, pp. 2873-2876.

Glavee, G.N. et al., Low Temperature Preparation of BaCeO3 and Ce0.75Zr0.25O2 Thin Films Using Sol-Gel Processing Techniques, Materials Research Bulletin, vol. 34, No. 5, Mar. 15, 1999, pp. 817-825.

Takahashi, Y. et al., Preparation of YBCO films on CeO2/Zr2Gd2O7/Hastelloy tapes by the TFA-MOD method, Physica C, North-Holland Publishing, vol. 378-381, Oct. 2002, pp. 1024-1027.

Sheth, Atul, et al., Bench Scale Evaluation of Batch Mode Dip-Coating of Sol-Gel LaAlO3 Buffer Material, IEEE Transactions on Applied Superconductivity, vol. 9, No. 2, Jun. 1999, pp. 1514-1518.

\* cited by examiner

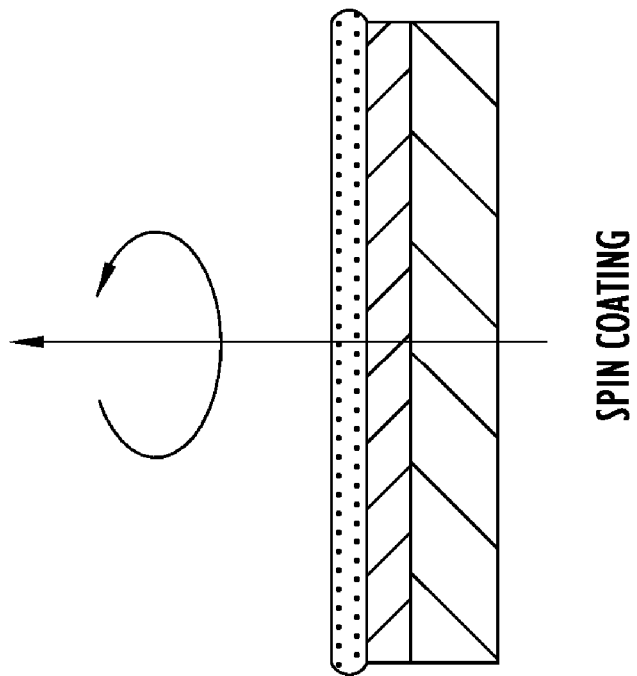
FIG.2B SPIN COATING
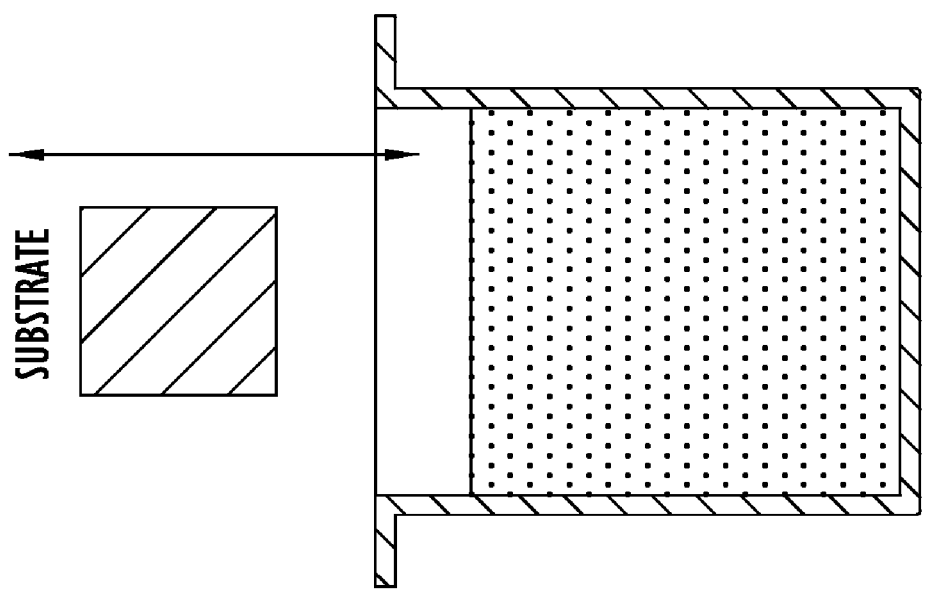
FIG.2A DIP COATING
SUBSTRATE

Ni(111) 5% W

IN-PLANE  FWHM=5.8°
OUT-OF-PLANE  FWHM=6.0°

LZO(222)

IN-PLANE  FWHM=5.7°
OUT-OF-PLANE  FWHM=6.9°

CGO(111)

IN-PLANE  FWHM=8.6°
OUT-OF-PLANE  FWHM=7.2°

PROCESS FOR THE PRODUCTION OF HIGHLY-TEXTURED, BAND-SHAPED, HIGH-TEMPERATURE SUPERCONDUCTORS

CROSS REFERENCE TO RELATED APPLICATIONS

This application is a continuation of International Application No. PCT/EP2005/008962, filed on Aug. 18, 2005, entitled "Process for the Production of Highly-Textured, Band-Shaped, High-Temperature Superconductors," which claims priority under 35 U.S.C. §119 to Application No. DE 102004041053.4 filed on Aug. 25, 2004, entitled "Process for the Production of Highly-Textured, Band-Shaped, High-Temperature Superconductors", the entire disclosures of which are hereby incorporated by reference in their entireties.

FIELD OF THE INVENTION

The invention relates to a process for the production of highly-textured, band-shaped high-temperature superconductors as well as the intermediate and end products of the process.

BACKGROUND

Several cuprate superconductors are already superconductive above the boiling point of liquid nitrogen (77° K.). These cuprate superconductors (called high-temperature superconductors (HTSL)), however, have poor mechanical properties. The development of band lines is an attempt to overcome the associated problems.

Band lines (also know as band-HTSL or band-shaped HTSL) are coated conductors including a superconductive functional layer applied to a band-shaped substrate via a special process. The functional layer may include, e.g., yttrium-barium-copper-oxide $YBa_2Cu_3O_x$ (YBCO). As shown in FIG. 1, these band lines have a structure including a metal substrate, a buffer layer, and a superconductor layer. The economic efficiency of the production process is determined by the deposition process, as well as by the superconductive properties.

The main difficulty in the production of coated conductors is that the HTSL (superconductive) layer must have an extremely high degree of texture, that is, a high degree of crystallographic orientation. The individual crystallites of the layer should be tilted against one another only by a minimum value, since otherwise the superconducting properties are severely impaired.

To achieve such a high degree of texture, two different preparation processes may be utilized. It is common to both preparations that, before the superconducting layer is deposited, a textured buffer layer is produced and placed on the substrate. Thus, when the superconducting layer is deposited on the buffer layer, the texture (orientation) is transferred to the superconducting layer. In the two preparations, metal substrates are used, since this is the only way that the strength of the band lines necessary for later use in electrical technology can be achieved.

In the first preparation process, an untextured, crystallographically-non-oriented metal substrate formed from, e.g., Hastelloy® alloy is used. A textured buffer layer (i.e., a buffer layer with crystallographic orientation) is then applied to the untextured substrate. Such a direct deposition can be carried out only using physical coating processes under high vacuum (e.g., Ion Beam Assisted Deposition (IBAD) and Inclined Substrate Deposition (ISD)). Drawbacks of this process are high equipment costs (caused, for example, by the high vacuum pressure requirements) and a low deposition rate. In the second preparation, the metal substrate is already textured by special deformation and temperature treatment processes. The texture of the substrate can thus be transferred to the buffer layer and, in turn, to the superconducting layer deposited thereon. The advantage of this method is that no directed deposition processes must be used. Here, physical processes, such as Pulsed Laser Deposition (PLD) and Thermal Co-Evaporation (TCE) and chemical processes, such as Chemical Solution Deposition (CSD) and Metal-Organic Chemical Vapor Deposition (MOCVD) may be used. Again, the PLD and TCE processes require high vacuum pressure (and thus high equipment costs), even though they provide higher deposition rates than direct deposition processes.

Chemical coating processes (e.g., Chemical Solution Deposition (CSD)) are economical relative to physical coating processes since they work at normal pressure (i.e., without the need for high vacuum pressure), while providing a higher deposition rate. FIG. 2 shows two CSD processes. As shown, on the laboratory scale, coating with CSD processes may be carried out as a "dip-coating" process (FIG. 2A), in which the substrate is immersed into a solution and pulled back out, or as a "spin coating" process (FIG. 2B), wherein several drops of the solution are applied to a substrate and distributed by rotating the substrate (centrifugal force spreads the solution on the substrate). For production of greater lengths, the substrate band can be drawn through a coating solution and then dried in a furnace. A diagram of such a system can be seen in FIG. 3. As shown, the system includes a rinsing unit, a coating unit, a drying unit, and a winding unit. The subsequent reaction is carried out at a high temperature.

In the CSD process, the reaction to form an actual crystalline layer is carried out in several steps. First, the substrate is coated and then dried (i.e., the solvent is removed), producing an amorphous layer that consists of organic and/or inorganic metal salts. The decomposable portions of the salts are pyrolyzed in a subsequent step. The pyrolyzed layer is crystallized in a last annealing step to form the final layer. These partial steps can be performed both in succession and by means of a temperature program within a single annealing treatment.

The superconductive properties considered in evaluating the economy of a coated conductor or its production process are the critical current density ($J_c$) and the critical current ($I_c$). Typically, values at 77 K (boiling point of nitrogen) with a criterion of 1 µV/cm of voltage drop are taken as a basis. All values indicated later on for the critical superconductive properties relate to this temperature and this criterion. The texture of the superconductive layer is, as described above, responsible for the quality thereof and thus influences in particular the critical current density $J_c$. Current achievable, typical values for YBCO layers, which were deposited by means of CSD processes on various buffer layers, are current densities of about 2 MA/cm². In this case, it is unimportant what approach was selected in accordance with the above-described design possibilities for coated conductors.

Possible buffer layer materials can be yttrium-stabilized zirconium oxide, gadolinium-zirconate, yttrium oxide, lanthanum-aluminate, lanthanum-zirconate, strontium-titanate, nickel oxide, cerium oxide, magnesium oxide, lanthanum-manganate, strontium-ruthenate and many others. In addition, layer combinations that consist of several different materials are possible. The maximum values for the critical current densities of CSD-YBCO layers are currently achieved in physically-produced buffer layers.

The critical current density is a central feature of a coated conductor, but this feature is not sufficient for the evaluation of the superconductive performance, since this value indicates nothing about the absolute critical current ($I_c$). A high, absolute critical current can only be achieved by comparatively thick, highly-structured YBCO layers, i.e., layers with high critical current density ($J_c$). Achieving a high degree of texture via the entire thickness of a superconductive layer is very difficult especially in layers that were deposited via a CSD process. While thin layers in the range of up to 50 nm have a very good texture and thus high $J_c$ values, $J_c$ is reduced when thicker layers are produced via conventional CSD processes, especially at the surface. Thus, it is not possible with the currently-used CSD process to produce coated conductors with a very high $I_c$.

One factor contributing to the inability to produce coated conductors with high $I_c$ is the solvents and precursor systems currently used for the deposition of the YBCO layers by means of CSD. The above-cited favorable results relative to $J_c$ were achieved utilizing a trifluoroacetate (TFA) system. In this coating system, all metals are dissolved as acetates in trifluoroacetic acid, such that formally complete metal-trifluoroacetates are produced, which remain on the substrate band in the drying of the coating solution after the evaporation of the acetic acid residues and trifluoroacetic acid. TFA solutions are primarily used since, when other, primarily organic metal salts are used, barium carbonate is produced during drying or in the pyrolysis of the coating. Barium carbonate is stable (it is not destroyed during the subsequent process conditions), and prevents the availability of barium for the formation of the YBCO superconductor, hampering current transport at the grain boundaries. Since barium fluoride is formed in the first pyrolysis step, the formation of barium carbonate in the TFA route is effectively prevented. The formation of barium fluoride also requires, however, that an annealing process must be added to the final crystallization of the superconductor water vapor—the water vapor must penetrate the deposited precursor layer from the surface to react with barium fluoride to form barium oxide and hydrofluoric acid. The hydrofluoric acid must, in turn, leave the layer. The required long diffusion paths for these relatively large molecules causes pores to form in the superconductor layer and, but prevents the growth of thick superconductive layers because, with increasing layer thickness, the diffusion possibilities are limited. This drawback can be partially avoided by a multi-layering. This approach, however, results in smaller and smaller increases in layer thickness and poorer textures in the case of the increasing number of coating cycles.

In addition to the diffusion problem, the use of fluorinated precursors in the coating solution is problematic because of the toxicity of the hydrofluoric acid that is produced during the processes. Hydrofluoric acid or hydrogen fluoride is already classified as very toxic even in the smallest concentrations. In technical systems, a large number of monitoring measures must be taken to prevent employee exposure and emissions into the environment. Moreover, the amount of trifluoroacetic acid (TFA) that is used should be kept small because of its ecotoxic action as well as biological effects (damaging action on water organisms can have long-lasting harmful effects in bodies of water, damaging action by pH shift, still caustic even in dilution, danger for drinking water). It is therefore desirable, both for reasons of safety at work and for environmental protection, as well as for reasons of process efficiency, to drop the fluorine content of the coating solution as much as possible or to dispense with fluorine-containing precursors completely.

Previously, no fluorine-free coating process for the superconductive layer could be developed for the production of YBCO layers, which also only approximately have the superconductive properties such as layers that were produced by means of the TFA method. Obviously, the use of fluorine-free systems is not possible because of the above-described problems of the barium carbonate formation. Consequently, focus has been placed on reducing the fluorine contents of the coating systems. This is carried out by, e.g., utilizing a mixture that consists of trifluoroacetic acid and acetic acid as a solvent. Thus, as in a pure TFA process, not all metal ions are formally completely present as trifluoroacetate but rather only, e.g., the barium ions. The other ions, i.e., copper and yttrium, are present in these systems as acetates or oxides after the coating solution is dried. The coating systems that are reduced in the fluorine portion reduce the release of hydrofluoric acid or hydrogen fluoride, and thus the environmental costs in the process. Since, however, the diffusion paths through the entire layer thickness are very long, no significant improvements in the texture or current density of thicker superconductive layers could be achieved with these systems.

SUMMARY

An object of the invention is to provide a process for the production of a band-shaped HTSL, in which the layer thickness of the superconductive layer is larger than 500 nm and in which $J_c$ is essentially independent of the layer thickness. Thus, the invention is directed toward a wet-chemical process for producing band-shaped high-temperature superconductors. The superconductors may include a substrate, a buffer layer, and a high-temperature superconductive layer. Precursor solutions may be applied in layers to the substrate. The first precursor solution layer contains little or no fluorine, while remaining precursor solution layers may have a fluorine concentration that gradually increases with each subsequent layer. The process results in band-shaped HTSL with increased texturing and improved layer thickness of the high-temperature superconductive layer.

BRIEF DESCRIPTION OF THE DRAWINGS

FIG. 2 illustrates schematic drawings of chemical solution deposition (CSD) coating processes. Specifically, FIG. 2A illustrates a dip coating process and FIG. 2B illustrates a spin coating process.

FIG. 7 illustrates the results of the $T_c$ and $J_c$ measurements on Sample YBZ289 (Example 1). Specifically, FIG. 7A illustrates R(T)-Dependency of the sample, while

FIG. 8 illustrates the results of the $T_c$ and $J_c$ measurements on Sample YBZ291 (Example 1). Specifically, FIG. 8A illustrates R(T)-Dependency of the sample, while

DETAILED DESCRIPTION OF THE INVENTION

Figure 1:
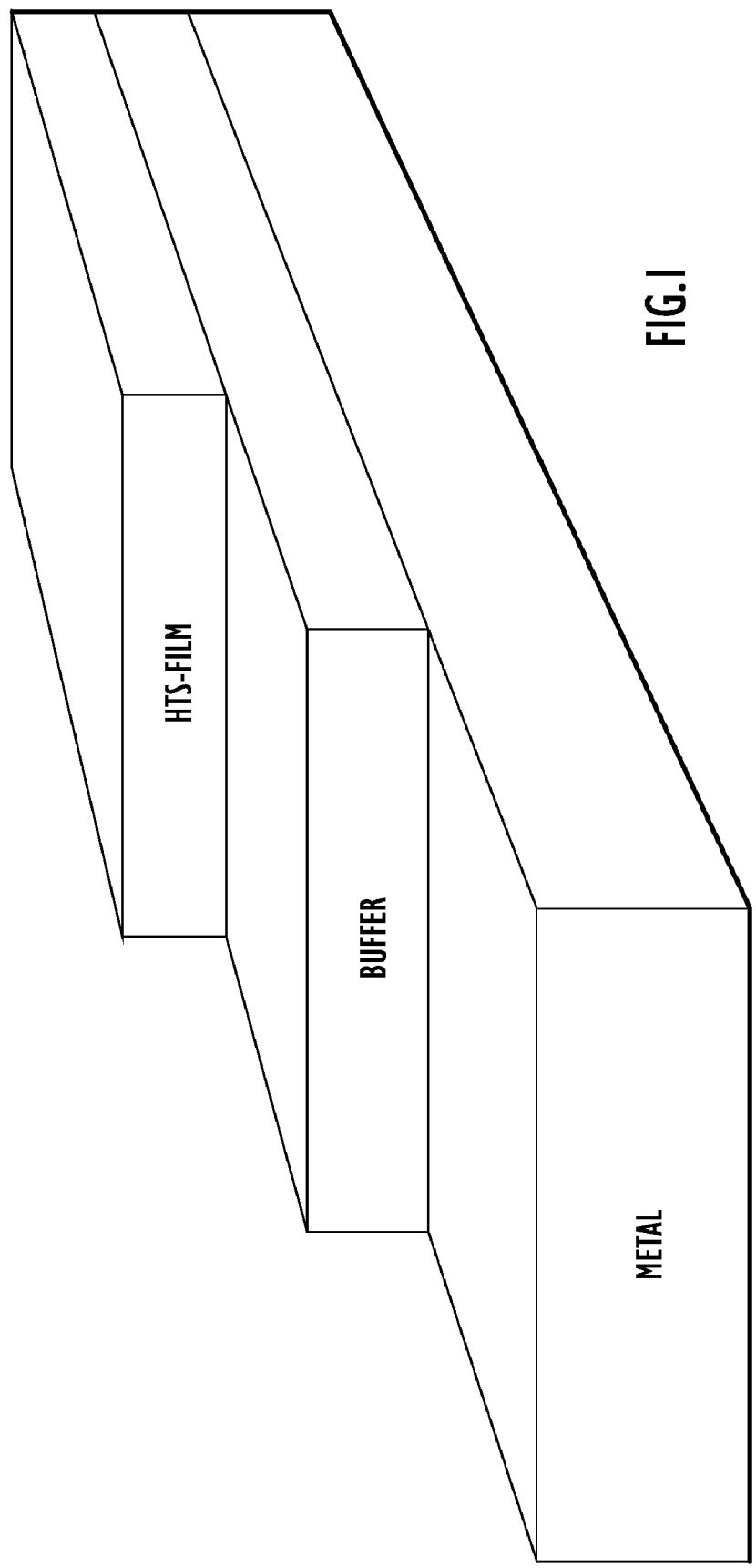
FIG. 1 illustrates the structure of a band-shaped HTSL in accordance with an embodiment of the invention.

The starting point of achieving the object was the consideration of significantly shortening the diffusion paths for the hydrofluoric acid or the hydrogen fluoride in the conversion of the precursors (e.g., barium fluoride) into the superconductors during the annealing treatment, since the latter limits the formation of qualitatively high-value superconductor layers as described above. The object was achieved by a multi-layering with different coating systems. This creates a multi-layered architecture in which a series of partial (or sub) layers form a completed layer. While coating can be carried out conventionally by applying one or more layers utilizing a coating solution including a particular formulation (which optionally can be fluorine-reduced), it is first coated according to the invention in a first step with a greatly reduced or completely fluorine-free coating solution, and then other subsequent coatings may be carried out with a fluorine-containing coating solution and/or with coating solutions with successively increasing fluorine content. By this process, multi-layered architecture in the precursor layer is produced, wherein the outermost layer contains the highest amount of fluorine content. Consequently, the diffusion paths during the build-up of the layer according to the invention are considerably smaller than in a conventional structure that consists of a homogeneous precursor layer. The partial layers that consist of fluorine-free or fluorine-reduced and fluorine-containing coatings are, in this case, applied in several cycles.

The process according to the invention makes it possible to reduce the overall fluorine content of the precursor layer drastically, since the fluorine-containing cover layer can be kept thin in comparison to the fluorine-free or fluorine-reduced layers. As a result, the emission from the hydrofluoric acid or hydrogen fluoride is greatly reduced or eliminated, and the processing is simplified.

In contrast to the previously known studies, the process according to the invention creates a thin, fluorine-containing partial layer effective to suppress the barium carbonate problems generated by the presence of the fluorine-free partial layer. This can be detected by diffraction diagrams, which show a universally high degree of texture in the superconductive layer and yield no reference to the presence of barium carbonate. This high degree of texture can be achieved in the superconductor layer only in the case of complete reaction of the individual metal precursors, since the presence of any barium carbonate would damage the texture.

Comparisons with conventional coating systems show another desired effect of the coating process according to the present invention. With the same number of coating cycles, it is shown that layer thicknesses with values more than a multiple above the conventional coatings are achieved utilizing the layered architecture according to the invention (i.e., the inventive process permits the creation much thicker layers in comparison to those formed using conventional processes). The measured texture over the entire layer shows no significant variation. That is, a uniform, high texture results, which, in turn, results in uniform high current density in the thick superconductive layer.

The production of textured Re—Ba—Cu—O layers (REBCO, with RE standing for Rare Earth and refers to elements of the group of rare earths, i.e., Y, Ho, Ce, Gd, etc.) of high current-carrying capacity with layer thicknesses of >500 nm is carried out by application of a fluorine-free REBCO-precursor layer, pyrolysis of this fluorine-free layer, followed by subsequent coating with a trifluoroacetic acid (TFA) solution. The pyrolysis of the TFA layer is carried out at temperatures of up to 400° C. in a moist $N_2/2.5\%$ $O_2$ atmosphere. Then, the common REBCO phase forming is performed at maximum temperatures of 780-790° C. in moist $N_2/100$ ppm of $O_2$ atmosphere. A small increase of the Cu content in the TFA precursor solution can result in the increase of $T_c$ and $J_c$. This happens by increasing the proportion of metal during the reaction, since the CuO precipitates serve as an oxygen source, and by the presence of quick diffusion paths for oxygen, as well as by the property of the precipitates of acting as pinning centers.

For the production of the coating solutions, it may be advantageous to heat the latter or to heat them while being stirred so that the latter boil under reflux. In addition, various additives can be mixed in the coating solution to have a positive influence on the coating process and to increase the stability of the solution. To improve the process, wetting agents (i.e., agents that reduce the surface tension of the coating solution and thus make possible a uniform coating over the surface and on the edges) and gelling agents (which enable uniform drying of the coating without flakes, cracks, and pores) may be used. To stabilize the solutions, moreover, antioxidants can be used.

The coating of the substrate with the coating solutions according to the invention can be carried out in various ways. The solutions can be applied by dip-coating (dipping the substrate in the solution), spin-coating (applying the solution to a rotating substrate), spray-coating (spraying or atomizing the solution on the substrate), capillary-coating (applying the solution via a capillary), ink-jet printing and similar techniques. During the application of a solution, structures in the superconductor layer can optionally be produced either by specific protection of areas, e.g., by means of photoresist and removal after the coating, or by the process itself, e.g., in the printing process such as the ink-jet printing.

The coating and drying can generally be carried out both in the batch process and continuously. Because of the lower handling cost, continuous systems are preferred. These systems consist of an unwinding device with an active or passive brake to keep the substrate band in the system under tension. This can be achieved by, e.g., a so-called dancer (double deflecting rollers with defined tensile force). The substrate band is then guided through the coating unit, which can consist of, e.g., a dipping bath. By arranging the guide rollers in different ways, different angles can be achieved for drawing the substrate band from the coating solution in the bath. In addition, the bath can be heated to increase the solubility of individual components in the solvent. The coating unit may be operated according to the invention also according to one of the additional, above-mentioned processes (except for spin-coating). After the coating unit, the drying of the coating is carried out in a drying section. This section may be operated both at one temperature and at several temperatures and temperature variations. For example, a two-stage process, wherein drying first takes place at a low temperature T1 (which is slightly below the boiling point of the solvent that is used), and a second temperature T2 (which is above the boiling point) may be used, which results in an especially homogeneous and thus crack- and pore-free coating. After the drying, the band is wound up again on a winding unit. Winding the band on a carrier pipe in the form of a flat coil (solenoid) is advantageous for the subsequent annealing treatment. This takes place by a simultaneous rotational and linear movement of the winding unit. A carrier for the band is, for example, a heat-resisting ceramic pipe or a coated metal pipe. The various units, in particular the coating unit and the drying unit, are advantageously configured such that the process can take place under a defined atmosphere. In the various units, it may be advantageous to set up different atmospheres. A higher vapor pressure of the solvent in the coating unit may be advantageous, e.g., to avoid excessive evaporation of the solvent from the coating bath and thus to avoid a concentration of the coating solution.

A good texture-transferring property of the buffer layer requires that the superconductive layer possess good texturing; therefore, a buffer layer with an improved texture-transferring property applied by means of CSD is preferably used. Such a process is described in U.S. Patent Application Publication No. 2007-0197045, the disclosure of which is incorporated herein by reference in its entirety. In addition, a buffer layer that is well textured even in the topmost layer areas is produced by means of the combination of polar solvent and metal oxides. FIG. 9 illustrates pole figures of a metal substrate (FIG. 9A), an LZO layer (FIG. 9B) and the CGO layer on the LZO layer (FIG. 9C), as well as the RHEED measurements of the LZO (FIG. 9D) and the CGO surfaces (FIG. 9E) produced in accordance with an embodiment of the 2007-0197045 publication.

For the protection of the superconductor and as an alternative current path in the case of failure of the superconductor layer, a metal layer can be applied as a functional layer, e.g., by means of galvanic methods or by vaporization. Non-limiting examples are provided below:

EXAMPLES

(1) Example 1

Y(III)-acetate-tetrahydrate (Y(CH$_3$COO).4H$_2$O; Alfa Aesar, 99.9% (REO), crystalline) and Cu(II)-acetate-monohydrate (Cu(CH$_3$COO)$_2$.H$_2$O; Aldrich, ≧99.9%, crystalline) are dissolved in water. After adding ethanol (CH$_3$CH$_2$OH: Merck, for synthesis, ≧99%, melting point: −114.5° C., boiling point: 78.3° C., flash point: 12° C.) and pivalic acid (trimethylacetic acid; (CH$_3$)$_3$CCOOH; Merck, for synthesis, >98%, melting point: 32-35° C., boiling point: 164° C., flash point: 64° C., solubility in H$_2$O: 25 g/l (25° C.)), the solution that is obtained is dried in a drying oven. The resulting mixture of Y(III)- and Cu(II)-trimethyl acetate is mixed with barium hydroxide-octahydrate (Ba(OH)2·8 H$_2$O; Merck, for analysis, ≧98%, melting point: 78° C.). By adding propionic acid (methylacetic acid, CH$_3$CH$_2$COOH; Merck, for synthesis, ≧99%, melting point: −21° C., boiling point: 141° C., flash point: 50° C.), propylamine(1-aminopropane, CH$_3$CH$_2$CH$_2$NH$_2$; Merck, for synthesis, >99%, melting point: −83° C., boiling point: 48-50° C., flash point: −30° C.), methanol (CH$_3$OH; Merck, for analysis, ACS, ISO, ≧99.8%, melting point: −98° C., boiling point: 64.5° C., flash point: 11° C.) and toluene (methylbenzene, C$_6$H$_5$CH$_3$); Merck, for spectroscopy, ≧99.9%, melting point: −95° C., boiling point: 110.6° C., flash point: 4° C.), a 0.2 mol colloidal solution is produced. In this case, solutions of smaller concentration produce a thinner layer with otherwise comparable values, while solutions of higher concentration (e.g., above 0.35 mol) produce layers that are too thick, which tend to form cracks and thus tend to poorer properties.

Strontium titanate substrates (orientation (100)) as well as metal bands (an alloy Ni −5 at % W) were provided with buffer layers and coated by the dip-coating process. The dwell time in the solution was 15 s. The samples were removed from the solution at an extraction rate of 0.1 cm/s. In this case, the extraction rate can vary within a wide range of from 0.04 to 0.5 cm/s, whereby a lower extraction rate produces a smaller layer thickness and a higher extraction rate produces a larger layer thickness. The drying of the layer was carried out at temperatures up to a maximum of 200° C. in a drying oven. The subsequent pyrolysis was performed at T≦600° C. in a chamber furnace in air. The substrates with the first pyrolyzed layer were then immersed twice in YBCO-TFA precursor solutions of different compositions (e.g., 0.25 mol relative to Y) with dwell times of 30 s and 15 s, and an extraction rate of 0.1 cm/s. The YBCO-TFA precursor solutions were produced as solvents from Y(III)-acetate-tetrahydrate ((CH$_3$COO). 4H$_2$O; Alfa Aesar, 99.99% (REO), crystalline), Ba(II)-acetate (Ba(CH$_3$COO)$_2$; Alfa Aesar, 99.999% (metal base)) and Cu(II)-acetate-monohydrate (Cu(CH$_3$COO)$_2$ H$_2$O: Aldrich, ≧99.99%, crystalline) with use of trifluoroacetic acid (CF$_3$COOH; Merck, for synthesis, >99%, melting point: −15° C., boiling point: 72° C. (which is hazardous to the environment)) and methanol (CH$_3$OH; Merck, for analysis, >99.8%, melting point: −98° C., boiling point: 64.5° C., flash point: 11° C. (which is toxic)). The compositions of the solutions were established as follows:

Precursor Solution 1: Y:Ba:Cu=1:2:3, 0.25 mol solution relative to Y. The solution was produced with an excess of 15% trifluoroacetic acid in comparison to the standard (prior art) composition.

Precursor Solution 2: Y:Ba:Cu=1:2:3.2-3.8.

The layers that were obtained were heat-treated in a humid atmosphere. The pyrolysis was carried out at T≦400° C. in N$_2$/2.5% O$_2$ atmosphere. The YBCO phase formation was performed under an atmosphere of N$_2$/100 ppm of O$_2$ at maximum temperatures of 780 to 790° C. and at a holding time of between one-half and one hour. The maximum temperature is always below the melting point of the YBCO. The melting point, in turn, depends on the oxygen concentration of the furnace atmosphere. At higher oxygen contents (e.g., of up to 1%), the melting point is increased by about 10°, while in oxygen-free atmosphere, the melting point is reduced by about 5°. The cooling of the samples was carried out in O$_2$ atmosphere with a holding time of 2 hours at a temperature of between 500 and 400° C. Typical results are:

Sample YBZ 289 (STO substrate, T$_{max}$=785° C., Precursor Solution 1, extraction rate 0.1 cm/s):

$T_{C50}$=89.8 K, $\Delta T_C$=1 K, $J_c$ (resistive)=1.15 MA/cm$^2$

FWHM (φ-scan)=2.50±0.03°, FWHM (ω-scan)= 0.90±0.01°

Layer thickness: ≈610 nm

Sample YBZ 291 (STO substrate, T$_{max}$=785° C., Precursor Solution 2 (1:2:3.4, extraction rate 0.1 cm/s):

$T_{C50}$=89.6 K, $\Delta T_C$=0.8 K, $J_c$ (resistive)=0.85 MA/cm$^2$

FWHM (φ-scan)=2.11°, FWHM (ω-scan)=0.95°

Layer thickness: ≈560 nm

Figure 7A:
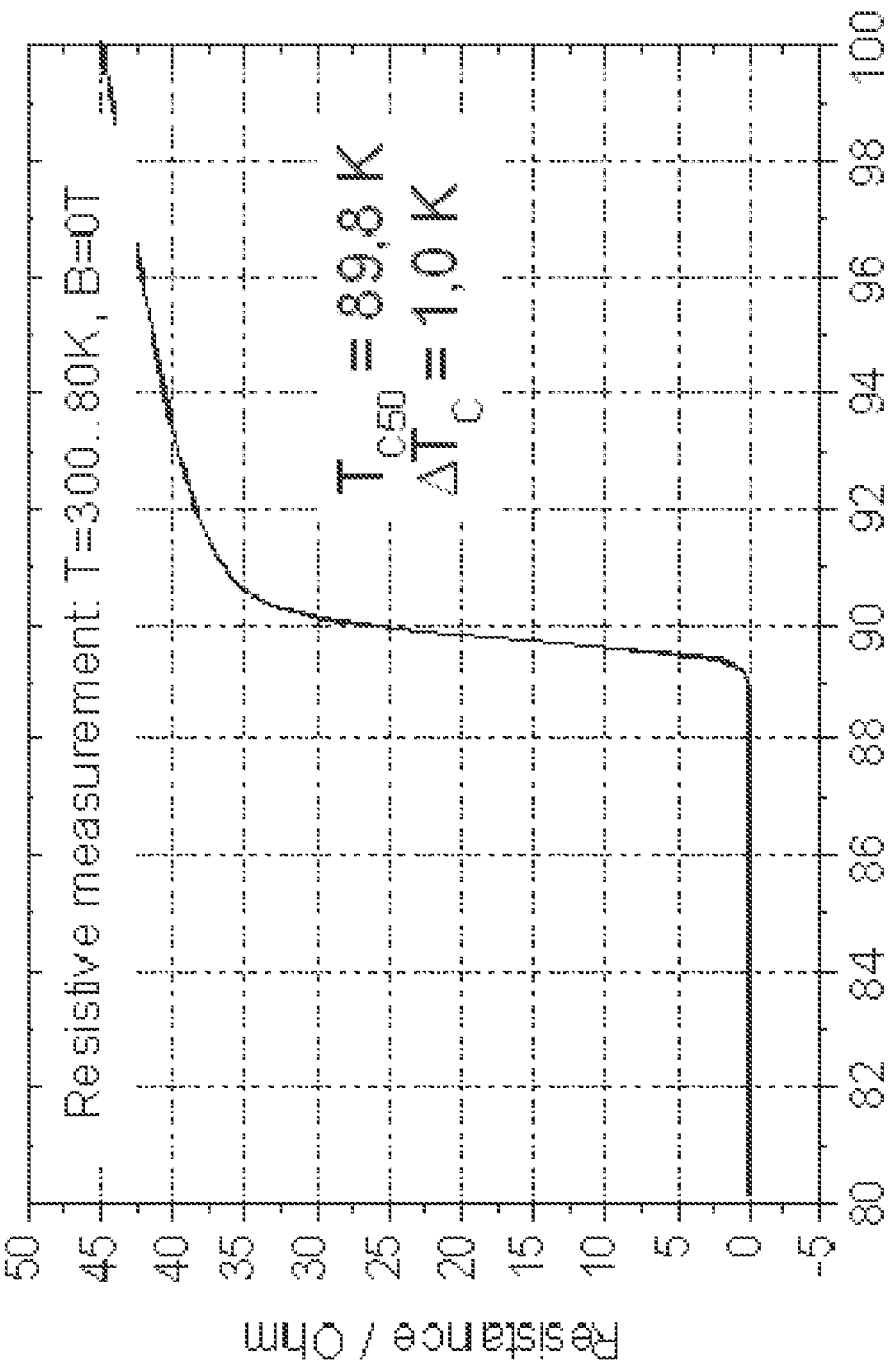
Figure 7B:
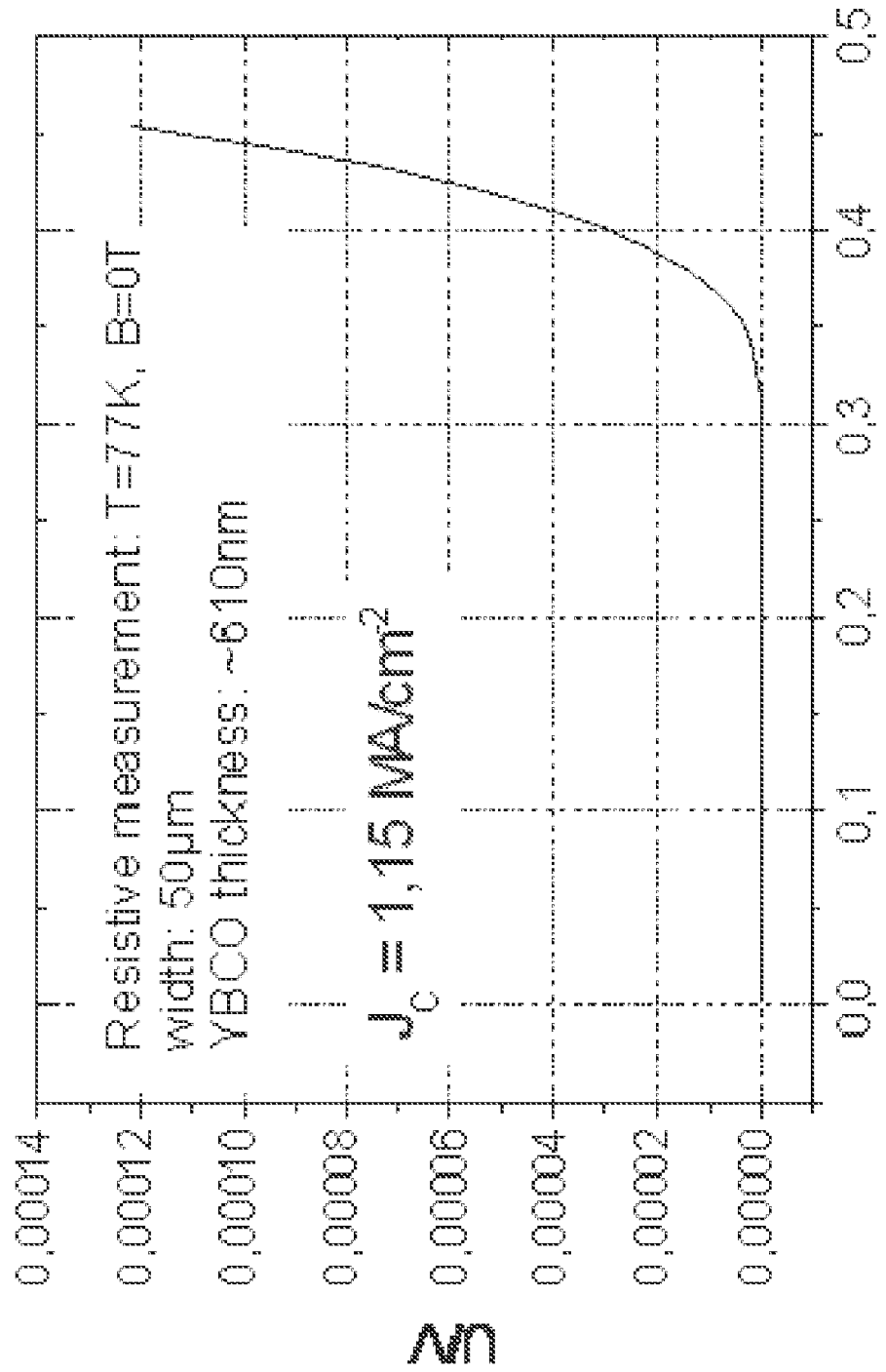
FIG. 7B illustrates the I-U dependency of the sample.
Figure 8A:
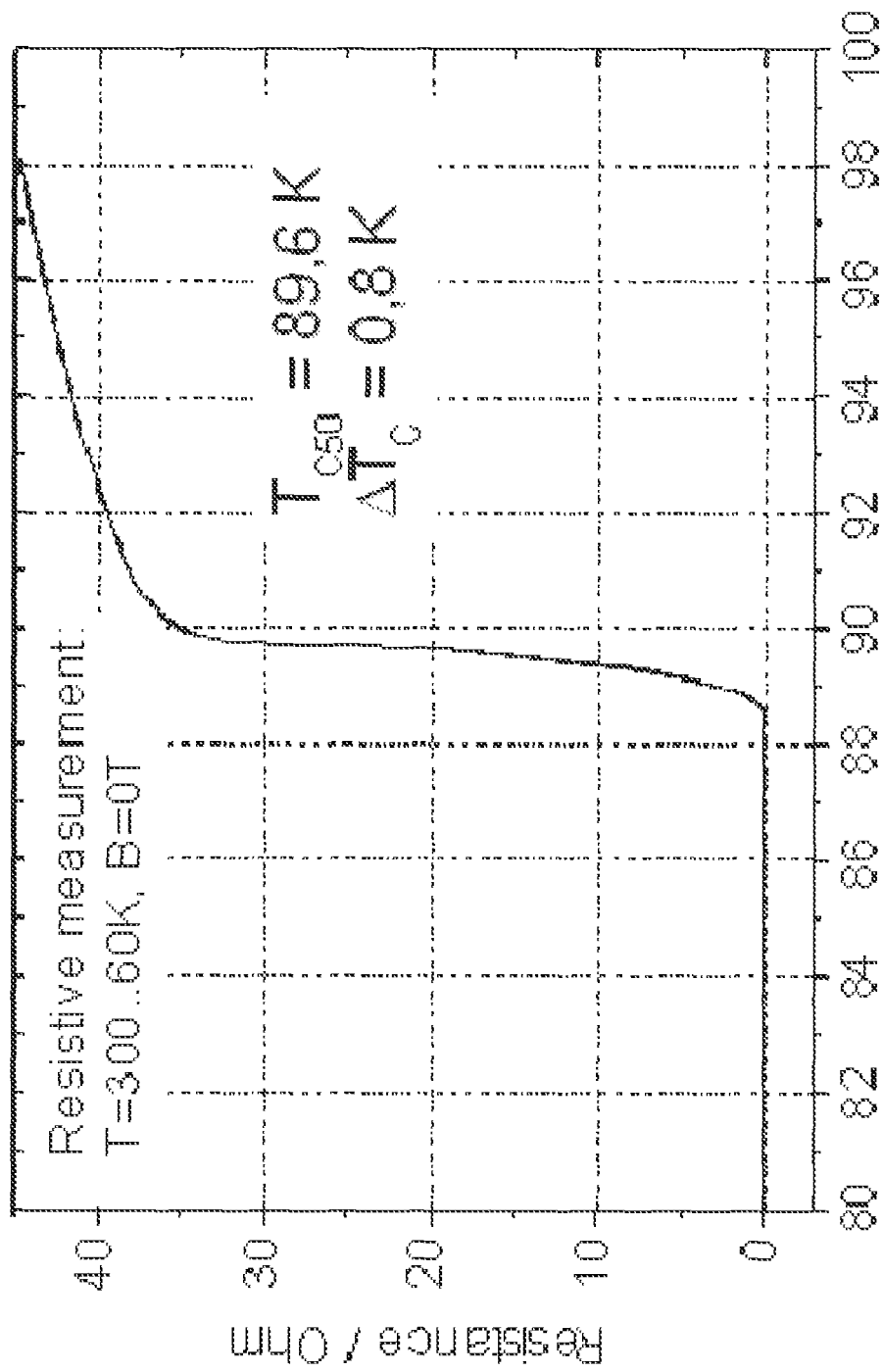
Figure 8B:
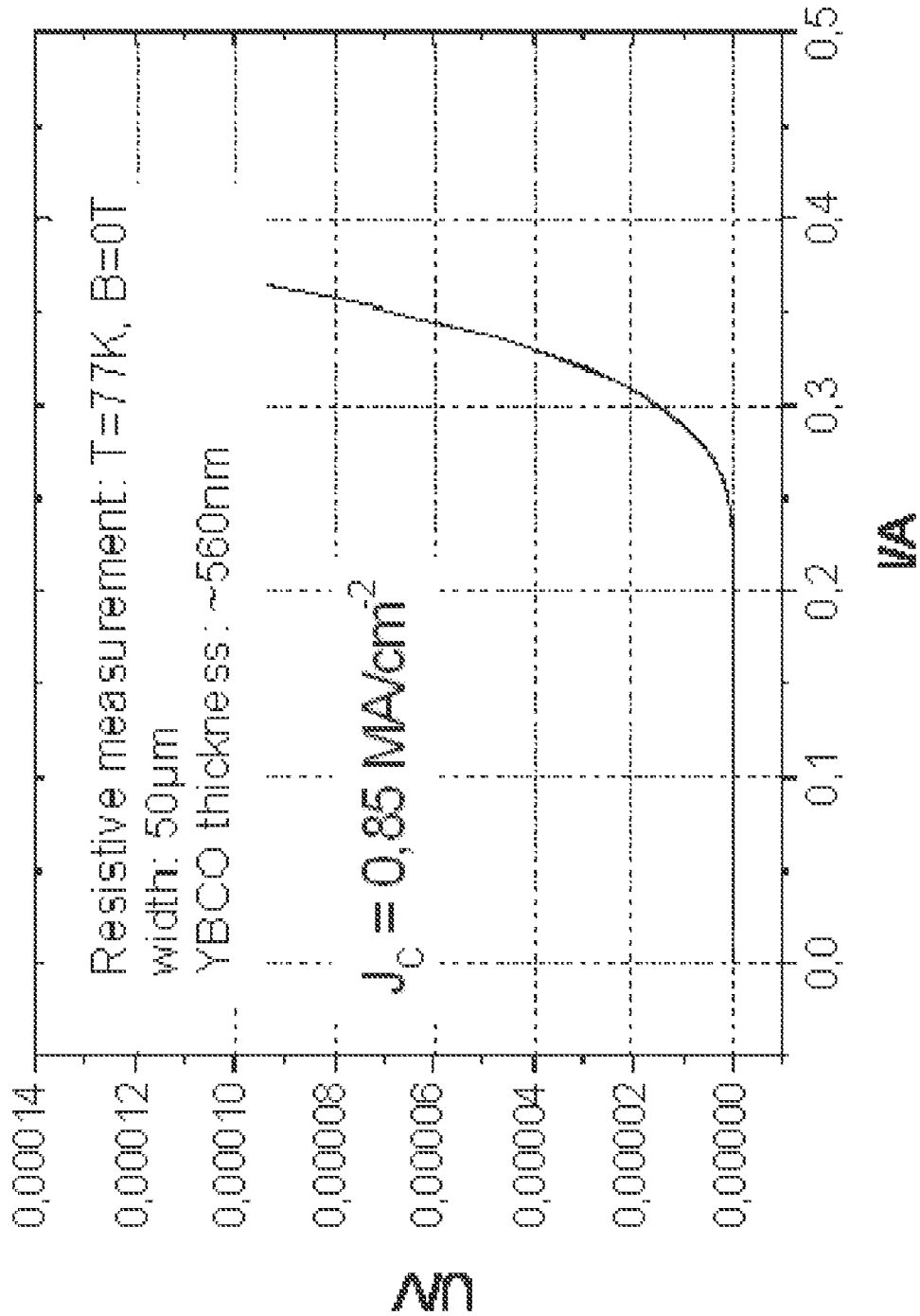
FIG. 8B illustrates the I-U dependency of the sample.
Figure 9A:
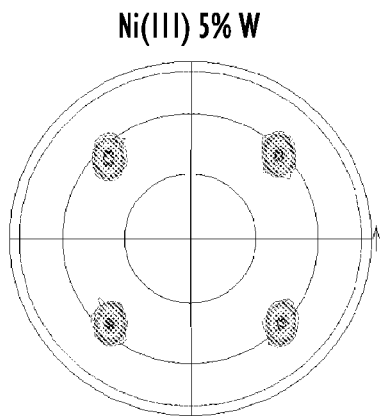
FIG. 9 illustrates pole figures of a metal substrate (FIG. 9A), an LZO layer (FIG. 9B) and the CGO layer on the LZO layer (FIG. 9C), as well as the RHEED measurements of the LZO (FIG. 9D) and the CGO surfaces (FIG. 9E) produced in accordance with an embodiment of the present invention.
Figure 9B:
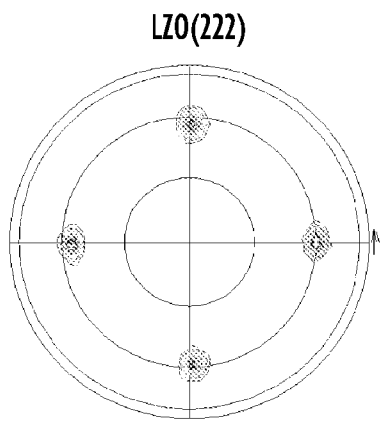
Figure 9C:
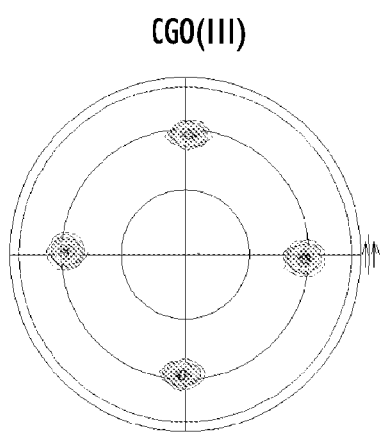
Figure 9E:
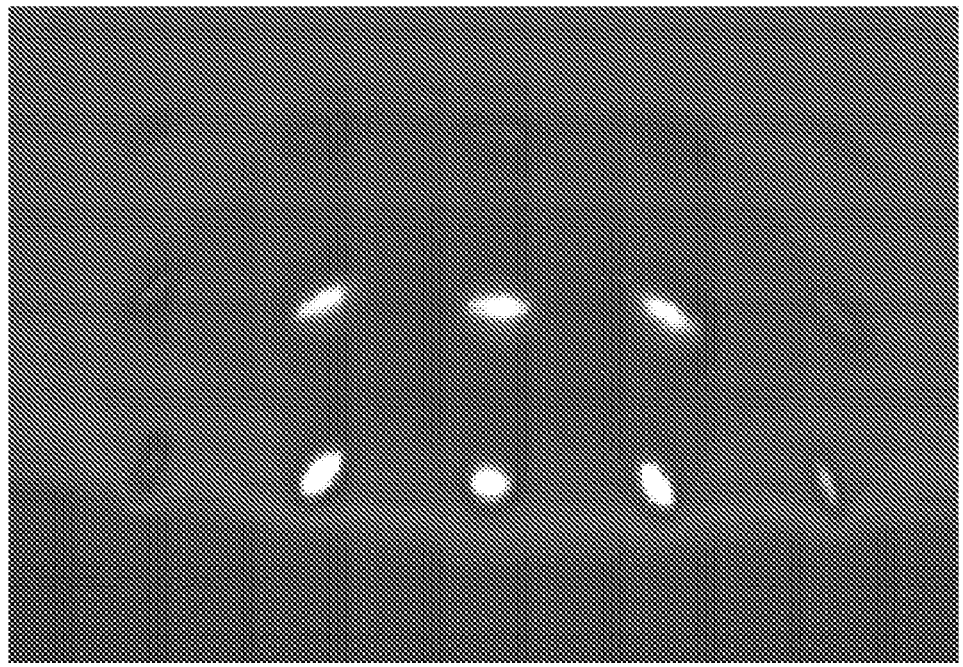
Figure 9D:
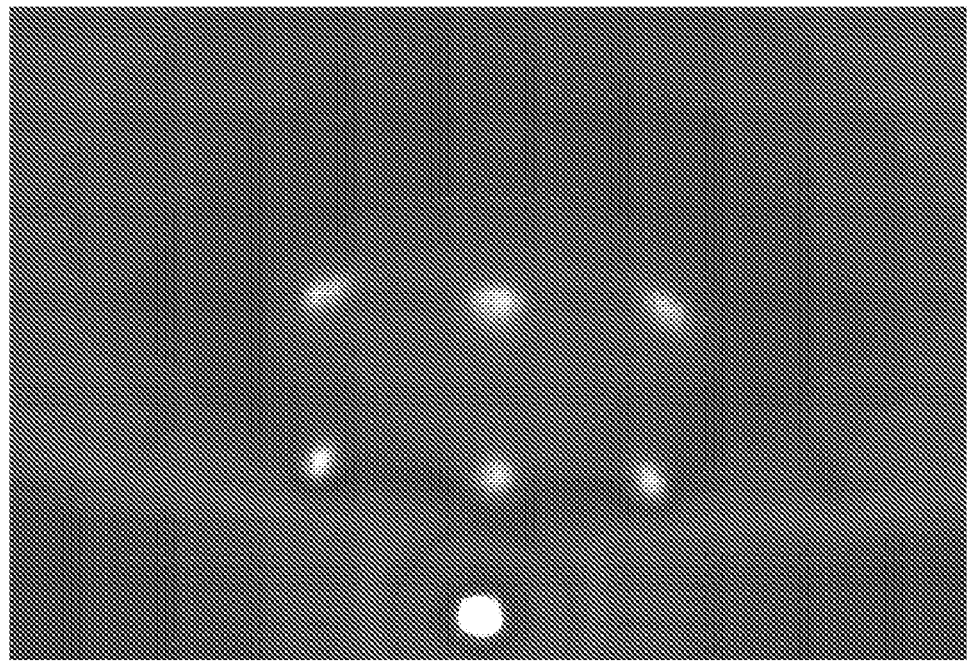

Results of the pole figure measurements as well as of Phi scans can be seen in FIGS. 5A and 5B and FIGS. 6A and 6B, while the results of T$_c$ and J$_c$ measurements can be seen in FIGS. 7A and 7B, as well as FIGS. 8 and 8B.

Comparable results can also be achieved when Ho(III)-acetate-tetrahydrate is used as a starting substance instead of Y(III)-acetate-tetrahydrate.

Example 2

In another test, the reaction conditions were varied. The fluorine-free precursor solution that was used was produced as indicated in Example 1. In contrast to Example 1, however, the solution had an increased viscosity. As a TFA-precursor solution, the above-indicated Solution 1 was used. A strontium titanate substrate (orientation (100)) was coated by the dip-coating process. The same coating, drying, and pyrolysis conditions as in Example 1 were selected for the fluorine-free YBCO precursor solution. Then, a 2× immersion in the TFA precursor solution was carried out with a dwell time of 30 s or 15 s, as well as an extraction rate of 0.2 cm/s. As long as the value does not drop below a minimum threshold value, the dwell time has no influence on the result. Depending on the wetting behavior of the solution, the minimum value is 2 to 5 seconds. The drying of the layer, the subsequent pyrolysis as well as the crystallization are carried out under the above-indicated conditions. With this process, it was possible to produce layers with increased layer thickness in comparison to Example 1.

Sample (STO substrate, fluorine-free YBCO precursor solution of slightly higher viscosity, $T_{max}$=785° C., Precursor Solution 1 (1:2:3), extraction rate 0.2 cm/s): Layer thickness: ≈880 nm Example 3

First, a buffer layer system was applied on a textured metal band (Ni–5 at % W) according to U.S. 2004/238085 and WO0060132A1, the disclosures of which are hereby incorporated by reference in their entireties. The metal band is a pure nickel band. By alloying in tungsten up to a proportion of 8%, the tensile strength of the band can be increased without affecting the result of the coating in this example. Also, other alloys, such as, e.g., Ni—O, 1% Mn, can be used without affecting the final result of this example.

Lanthanum(III) and zirconium(IV)-(2,4)pentanedionate (acetyl acetonate)(lanthanum (III)-(2,4)pentanedionate, $La[CH_3COCHCOCH_3]_3 \cdot x\ H_2O$; Alfa Aesar, 99.9% (REO), powder, melting point: 143° C.; zirconium(IV)-(2,4)pentanedionate, $Zr[CH_3COCHCOCH_3]_4$; Strem Chemicals, ≧98%, crystalline) are the basis of the coating solution for a first buffer layer. The solution was set at a concentration of 0.1 M relative to $La_2Zr_2O_7$ according to buffer stoichiometry. For specified setting of the metal contents, the starting substances were characterized by means of ICP-OES (Inductively Coupled Plasma Optical Emission). As a solvent for the solution, proprionic acid (propionic acid, $CH_3CH_2COOH$: Merck, ≧99%, melting point: –21° C., boiling point: 141° C., flash point: 50° C.) was used.

The coating was carried out on substrate bands with a cross-section of 5×0.1 mm$^2$ and a length of 50 m in a continuous coating apparatus.

Figure 3:
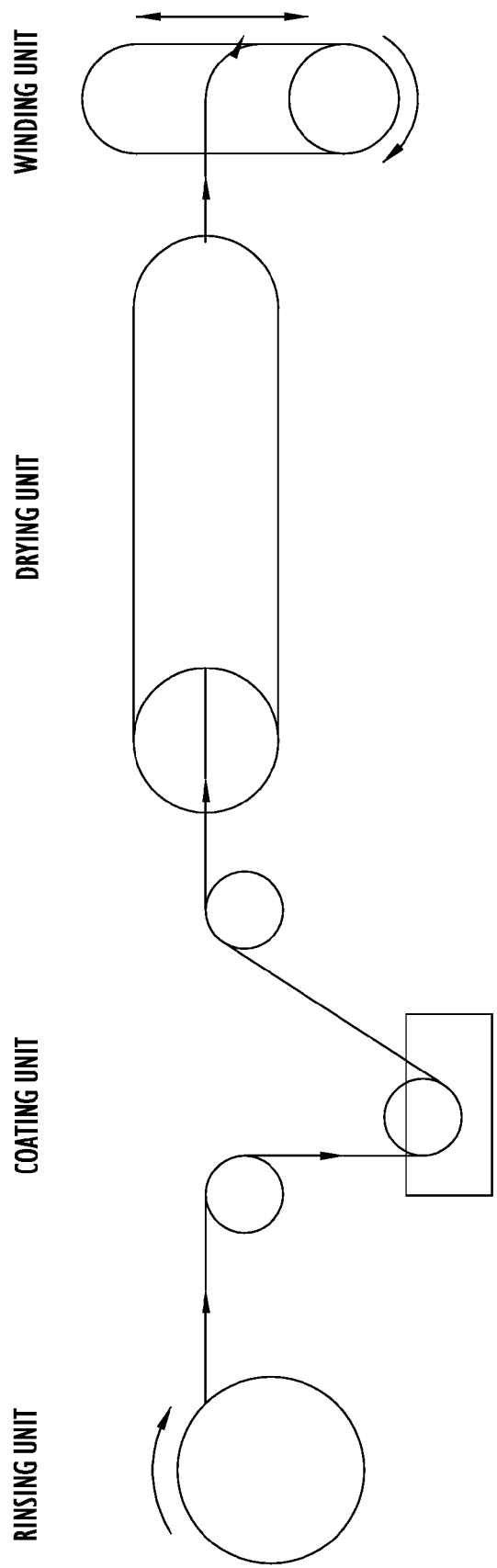
FIG. 3 illustrates a system for continuous coating via a CSD process in accordance with an embodiment of the invention.
Figure 4:
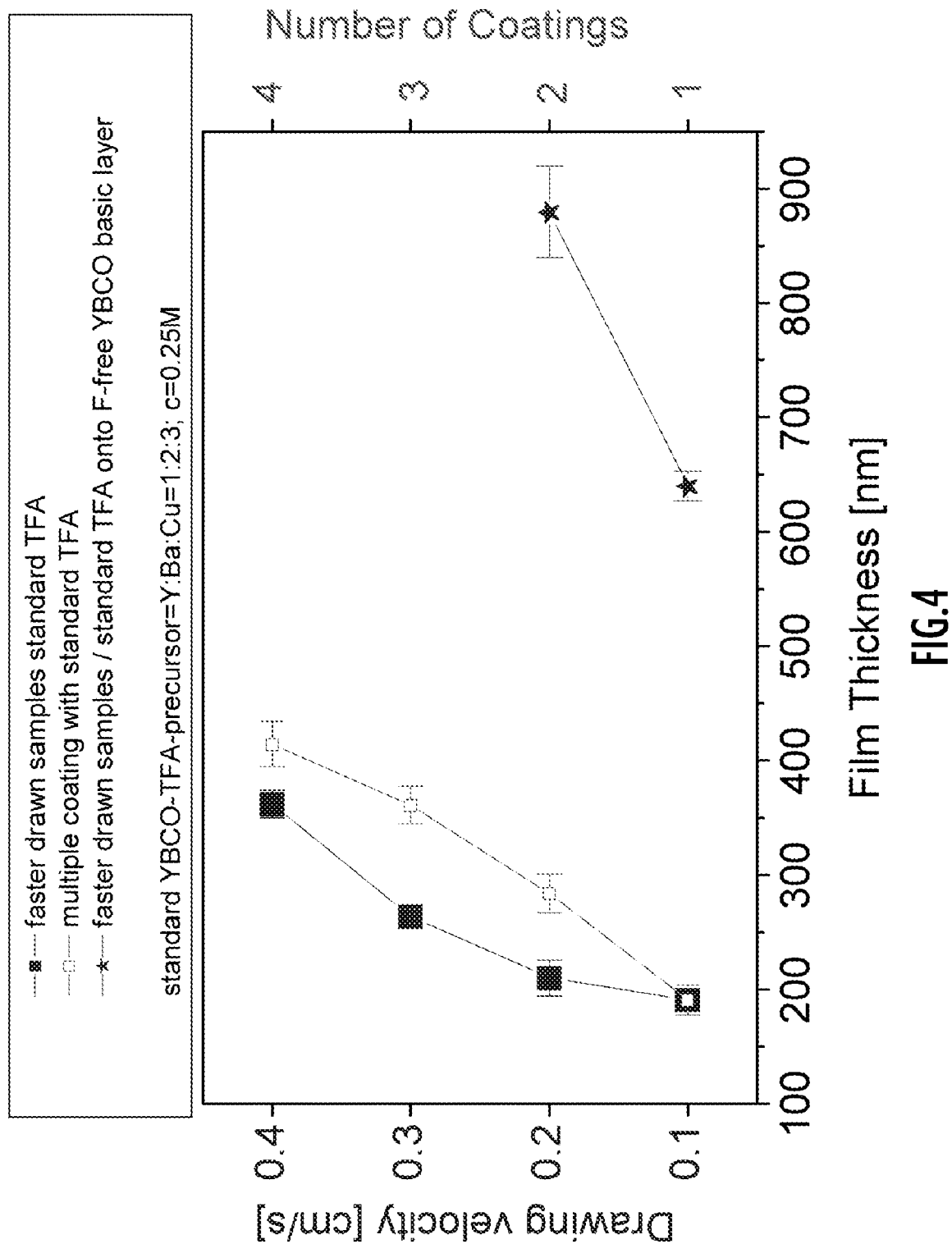
FIG. 4 illustrates a graph plotting layer thickness as a function of the extraction rate or the number of coatings.

This apparatus consists of a rinsing unit, a coating unit, a drying unit, and a winding unit (FIG. 3). The band is pulled through the system under a drawing force of 10N at a rate of 5 cm/minute. In this case, the tensile force is selected such that it is less than the yield point of the metal band that is used. The coating is carried out at a pull-out angle of 70° relative to the solution surface. The pull-out angle can be varied within a range of 20-90°, whereby a smaller angle means a larger layer thickness. Equal layer thicknesses can be achieved with, e.g., the combination of 70° and 5 cm/min as well as 90° and 5.8 cm/min. The drying is carried out in two steps. The pre-drying is carried out below the boiling point of the solvent (methanol; 65° C.), at temperatures of 60° C. on a 50 cm segment, and the final drying is carried out on a 100 cm segment at a temperature above boiling point of the solvent temperature, i.e., 90° C. After drying, the band is wound up in the form of a spiral (solenoid) on a ceramic pipe (corundum) with a diameter of 20 cm and a length of 100 cm. FIG. 4 illustrates a graph showing the layer thickness as a function of the extraction rate or the Number of Coatings The band is moved with the carrier pipe into an annealing furnace and crystallized at a temperature of 900° C. within 2 hours.

As a second buffer layer, cerium oxide was applied. The coating solution consists here of Ce(III)acetate, dissolved in propionic acid, 2-propanol and acetyl acetone (Ce(III)-acetate, $Ce(CH_3COO)_3 \cdot xH_2O$; Sigma-Aldrich Chemie, 99.9% and propionic acid, $CH_3CH_2COOH$: Merck, ≧99%, melting point: –21° C., boiling point: 141° C., flash point: 50° C. and 2-propanol (isopropanol), $(CH_3)_2CHOH$; Sigma-Aldrich Chemie, 99.5%, boiling point 82° C. and acetyl acetone, $CH_3COCH_2COCH_3$; Sigma-Aldrich Chemie, >99%, boiling point 140° C. The solvents had the ratio 5:2:1, whereby it can be varied within a wide range with a proportion of propionic acid >50%. The solution concentration was set at 0.25 M. The coating solution was applied analogously to the first coating solution. The crystallization was carried out at temperatures of 950° C. within one hour. Pole figures and RHEED measurements (see FIG. 9) show an excellent texturing of the buffer layer.

After exchange of the buffer coating solution in the continuous coating system for a fluorine-free YBCO coating solution according to Example 1, the band that is obtained is moved through the system at a rate of 6 cm/minute under otherwise unaltered conditions and in turn wound on a ceramic carrier pipe. The applied layer was then pyrolyzed on the ceramic carrier pipe at 600° C. under air. In this case, the temperature must be at least 550° C. After renewed exchange of the coating solution for a fluorine-containing solution according to Example 1, in turn, a passage through the system at a rate of 0.2 cm/s was carried out.

The band with the obtained layers was heat-treated on the ceramic carrier pipe in humid atmosphere. The pyrolysis was carried out at T≦400° C. in $N_2$/2.5% $O_2$ atmosphere. The crystallization was performed under an atmosphere of $N_2$/100 ppm of $O_2$ at maximum temperatures from 780 to 790° C. and with a holding time of between one-half and one hour. In this case, the maximum temperature is below the melting point of the YBCO. The melting point in turn depends on the oxygen concentration of the furnace atmosphere. At higher oxygen contents of up to 1%, the melting point is increased by about 10°, and reduced by about 5° in the case of oxygen-free atmosphere. The cooling of the samples was carried out in $O_2$ atmosphere with a holding time of 2 hours at a temperature of between 500 and 400° C. Typical results are:

Pole figure measurements, Phi scans as well as $T_c$ and $J_c$ measurements of selected short samples yielded measuring results that correspond to those of the measurements of samples from Example 1, produced according to the invention.

What is claimed is:

1. A process of forming a band-shaped high temperature superconductor including a metal substrate and a high temperature superconductor layer (HTSL) having a multi-layer architecture formed of at least two precursor layers, the process comprising:
   (a) forming a first precursor solution comprising a first solvent;
   (b) applying the first precursor solution to the metal substrate;
   (c) drying and pyrolyzing the first precursor solution to form a first superconductor precursor layer;
   (d) forming a second precursor solution comprising a second solvent;
   (e) applying the second precursor solution to the first superconductor precursor layer;
   (f) drying and pyrolyzing the second precursor solution to form a second superconductor precursor layer; and
   (g) thermally treating the precursor layers to form the HTSL,
   wherein a fluorine concentration of the first precursor solution is less than a fluorine concentration of the second precursor solution.

2. The process of claim 1 further comprising applying a third precursor solution including a third solvent, wherein the third precursor solution possesses a higher fluorine concentration than the first and second precursor solutions.

3. The process of claim 2, wherein the first precursor layer is essentially fluorine free.

4. The process of claim 2, wherein at least one of the the first, second, and third solvent is selected from the group consisting of propionic acid, pivalic acid, methanol, and toluene.

5. The process of claim 1, wherein the heat treatment (f) is carried out at temperatures below the melting point of the HTSL.

6. The process of claim 1, wherein the first precursor solution comprises a compound selected from the group consisting of Y(III)-trimethyl acetate, Ho(III)-trimethyl acetate, Cu(II)-trimethyl acetate, and barium hydroxide-octahydrate.

7. The process of claim 1, wherein the second precursor solution comprises trifluoroacetic acid.

8. The process of claim 1, wherein the second precursor solution comprises trifluoroacetate.

9. The process of claim 1, wherein:
   the second precursor solution comprises YBCO; and
   the second precursor solution comprises less than about 6 mol of fluorine per mol of YBCO.

10. The process of claim 1, wherein:
    the second precursor solution comprises YBCO; and
    the second precursor solution comprises at least 30 mol of fluorine per mol of YBCO.

11. The process of claim 1, wherein at least one buffer layer is applied to the substrate before the first precursor solution is applied.

12. A process for the production of band-shaped HTSL including a metal substrate, at least one buffer layer, and an HTSL located on the buffer layer, the process comprising:
    (a) producing a coating solution comprising a polar solvent with at least one free hydroxyl group;
    (b) applying the coating solution to the metal substrate;
    (c) drying the coating solution;
    (d) forming a buffer layer by annealing the dried coating solution;
    (e) providing a first precursor solution comprising a first precursor solvent;
    (f) applying the first precursor solution to the buffer layer;
    (g) drying and pyrolyzing the first precursor solution to form a first superconductor precursor layer;
    (h) providing a second precursor solution comprising a second precursor solvent;
    (i) applying the second precursor solution to the first precursor layer;
    (j) drying and pyrolyzing the second precursor solution to form a second superconductor precursor layer; and
    (k) thermally treating the precursor layers to form the HTSL,
    wherein the fluorine concentration of the first precursor solution is less than the fluorine concentration of the second precursor solution, and wherein the fluorine content of the resulting first superconductor precursor layer is less than the fluorine content of the resulting second superconductor precursor layer.

13. The process of claim 12, wherein the polar solvent comprises a carboxylic acid.

14. The process of claim 13, wherein the carboxylic acid comprises propionic acid.

15. The process of claim 12, wherein the coating solution further comprises at least one compound selected from the group consisting of a zirconium compound, a lanthanum compound, and a rare earth compound.

16. The process of claim 15, wherein:
    the zirconium compound comprises zirconium(IV) 2,4-pentadionate;
    the lanthanum compound comprises lanthanum(III) 2,4-pentadionate; and
    the rare earth compound is selected from the group consisting of cerium(III) acetylacetonate, Gd(III) acetylacetonate, and yttrium(III) 2,4-pentadionate.

17. The process of claim 12, wherein the substrate comprises a textured, non-ferromagnetic metal band.

18. The process of claim 17, wherein the metal band comprises a Ni-Wo alloy or a Ni—Mn alloy.

19. The process of claim 12 further comprising (l) applying a functional metal layer to the HTSL.

20. A process of forming a band-shaped HTSL, the process comprising:
    (a) applying a first precursor solution to a metal substrate;
    (b) treating the first precursor solution to form a first superconductor precursor layer;
    (c) applying a second precursor solution to the first precursor layer;
    (d) treating the second precursor solution to form a second superconductor precursor layer, wherein the first superconductor precursor layer possesses a lower concentration of fluorine than the second superconductor precursor layer; and
    (e) thermally treating the layers to form the HTSL, wherein the formed HTSL possesses a multilayer architecture defined by the superconductor precursor layers.

21. The process of claim 20, wherein the first superconductor precursor layer is fluorine free.

22. The process of claim 21, wherein:
    (b) comprises (b.1) drying the first precursor solution and (b.2) pyrolyzing the first precursor solution to form the first superconductor precursor layer; and (d) comprises (d.1) drying the second precursor solution and (d.2) pyrolyzing the second precursor solution to form the second superconductor precursor layer.

23. The process of claim 20 wherein:
the process further comprises:
(f) applying a buffer solution to the metal substrate, and
(g) treating the buffer solution form a buffer layer; and
(a) comprises (a.1) applying the first precursor solution to the buffer layer.

24. The process of claim 23, wherein the buffer solution comprises a polar solvent with at least one free hydroxyl group.

25. The process of claim 20, wherein (d) further comprises applying a third precursor solution to the second superconductor precursor layer and treating the third precursor solution to form a third superconductor precursor layer, wherein the third superconductor precursor layer possesses a higher concentration of fluorine than the first and second superconductor precursor layers.

* * * * *

UNITED STATES PATENT AND TRADEMARK OFFICE
CERTIFICATE OF CORRECTION

| | |
|---|---|
| PATENT NO. | : 7,763,569 B2 |
| APPLICATION NO. | : 11/678704 |
| DATED | : July 27, 2010 |
| INVENTOR(S) | : Michael Backer et al. |

Figure 5A:
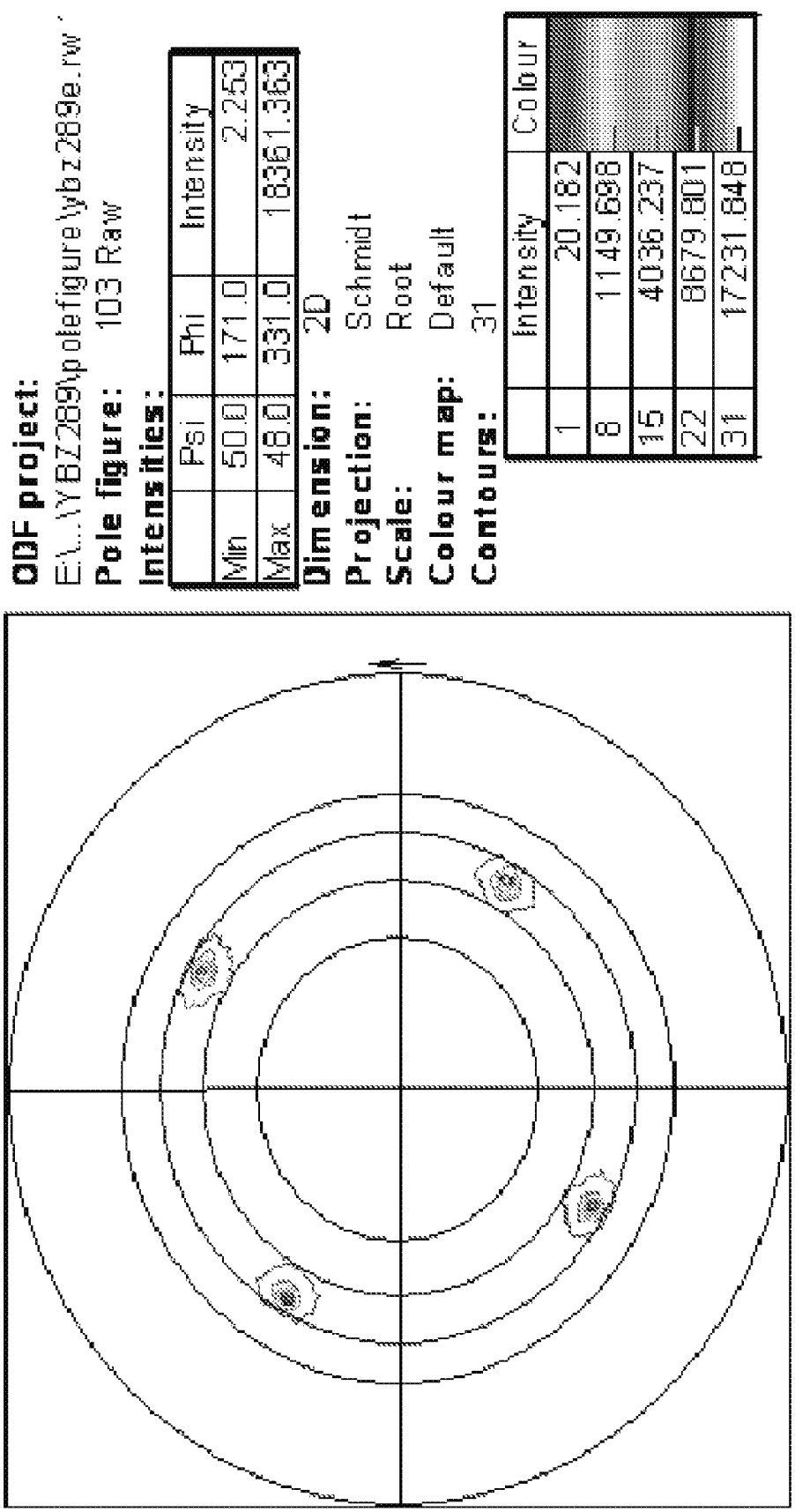
FIG. 5A illustrates pole figures of Sample YBZ289 (Example 1, TFA Solution 1).
Figure 5B:
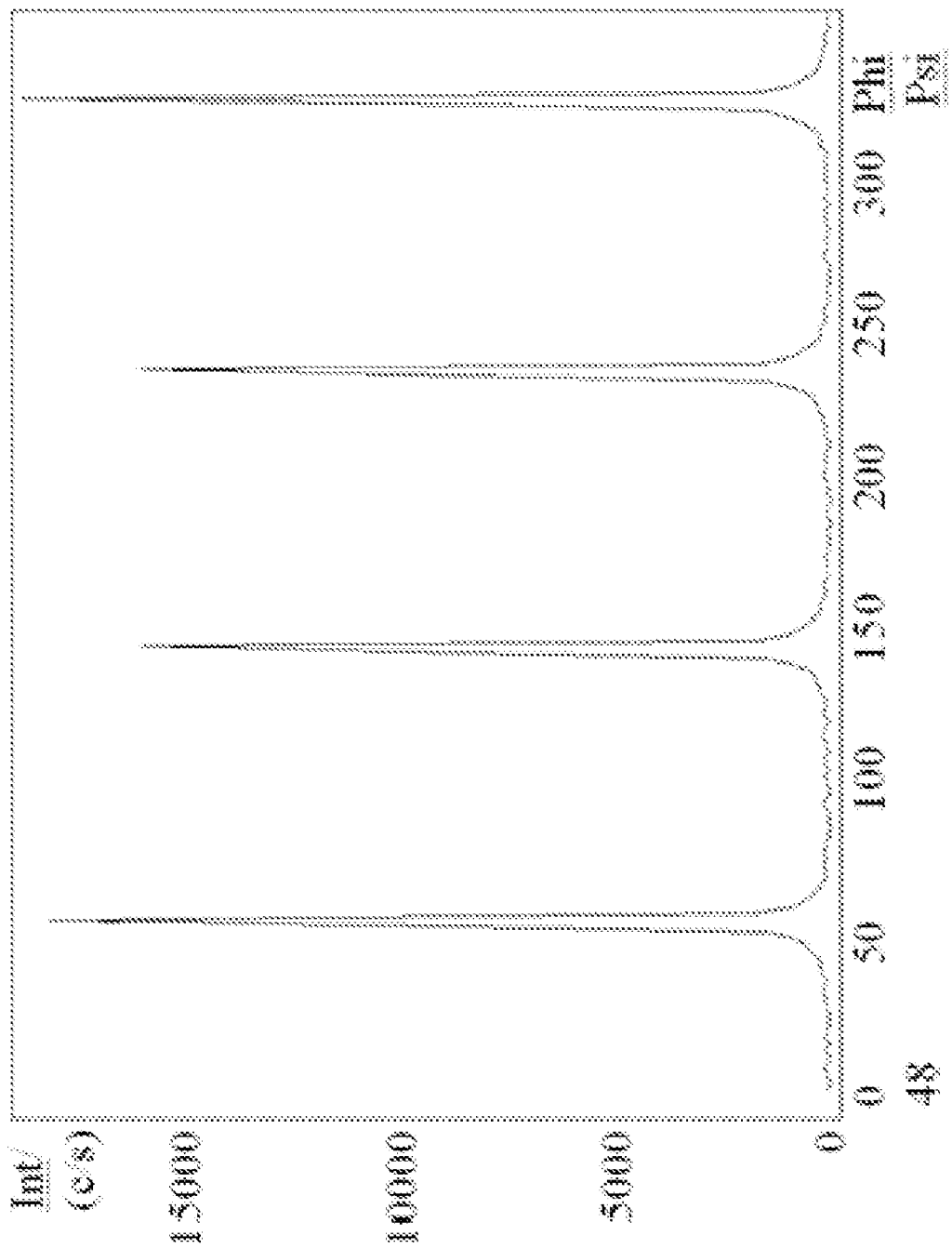
FIG. 5B is a graph of the corresponding phi scans.
Figure 6A:
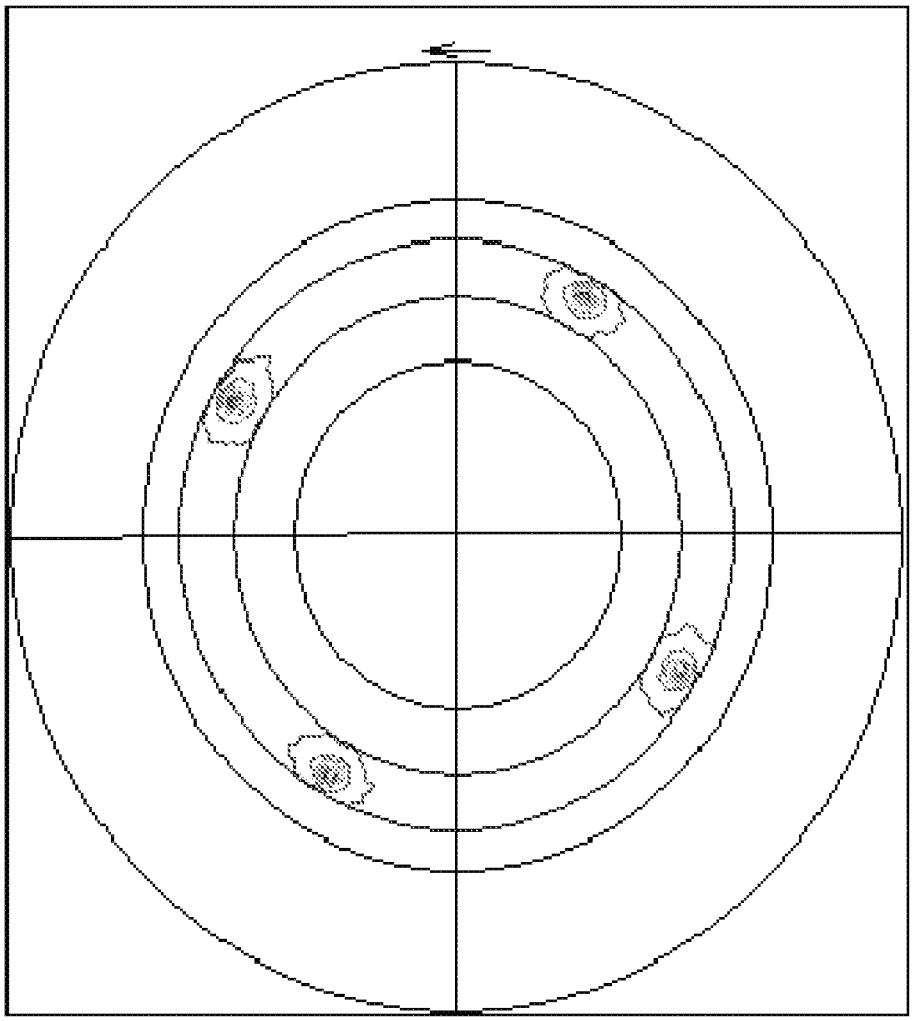
FIG. 6A illustrates pole figures of Sample YBZ291 (Example 1, TFA Solution 2).
Figure 6B:
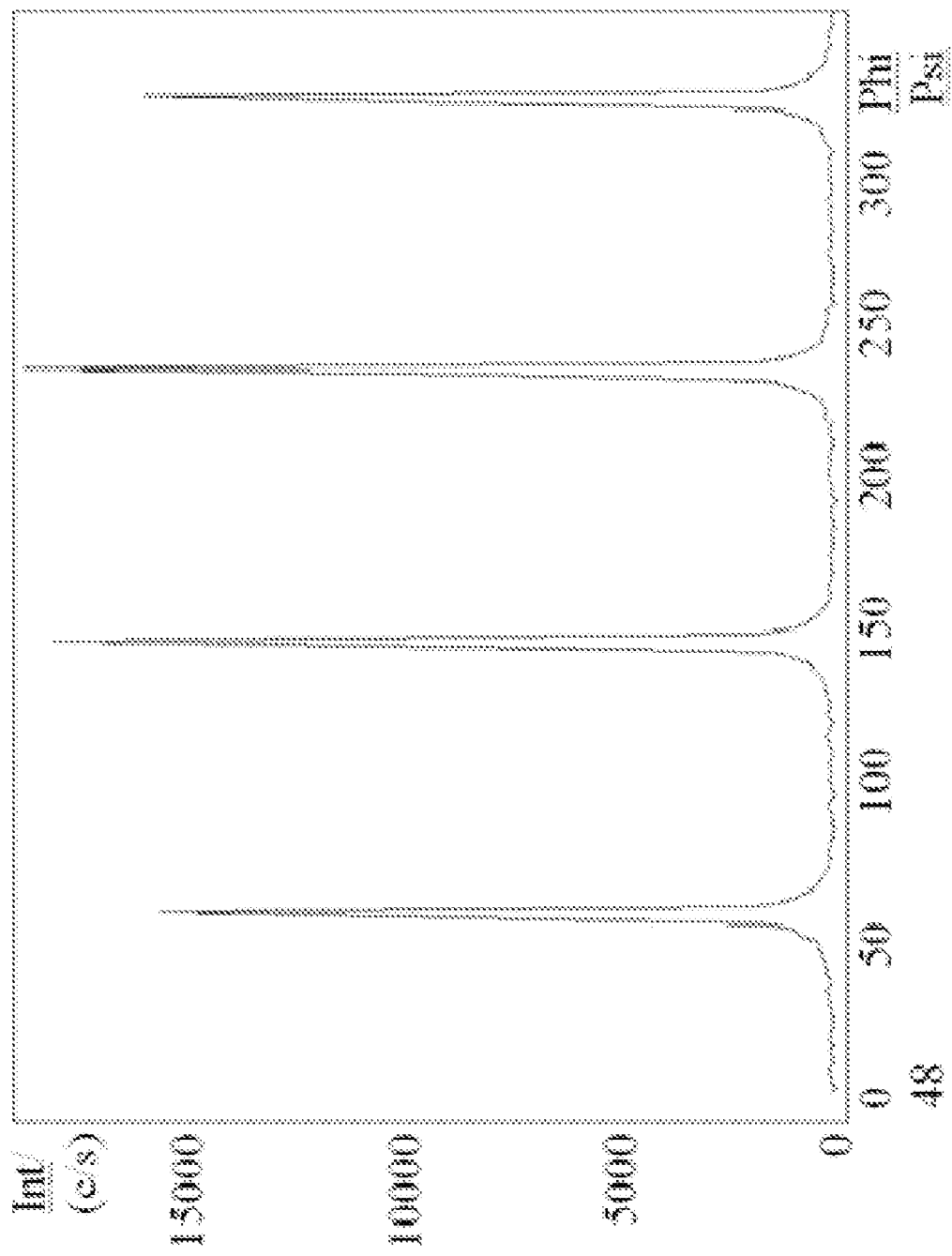
FIG. 6B. 2).

It is certified that error appears in the above-identified patent and that said Letters Patent is hereby corrected as shown below:

Col. 4, line 60, the phrase "2). FIG.5B" should be deleted.

Col. 11, lines 36-37, replace "one of the the first," with -- one of the first, --.

Signed and Sealed this

Twelfth Day of October, 2010

David J. Kappos
*Director of the United States Patent and Trademark Office*